(12) United States Patent
Leobandung (10) Patent No.: US 10,061,617 B2
(45) Date of Patent: Aug. 28, 2018

(54) SMART MEMORY ANALOG DRAM (71) Applicant: International Business Machines Corporation, Armonk, NY (US)

(72) Inventor: Effendi Leobandung, Stormville, NY (US)

(73) Assignee: International Business Machines Corporation, Armonk, NY (US)

(\*) Notice: Subject to any disclaimer, the term of this patent is extended or adjusted under 35 U.S.C. 154(b) by 260 days.

(21) Appl. No.: 15/175,181

(22) Filed: Jun. 7, 2016

(65) Prior Publication Data
US 2017/0351548 A1 Dec. 7, 2017

(51) Int. Cl.
*G11C 11/409* (2006.01)
*G06F 9/50* (2006.01)
*G11C 11/4076* (2006.01)

(52) U.S. Cl.
CPC .......... *G06F 9/5016* (2013.01); *G11C 11/409* (2013.01); *G11C 11/4076* (2013.01)

(58) Field of Classification Search
CPC .. G06F 9/5016; G11C 11/4076; G11C 11/409
See application file for complete search history.

(56) References Cited

U.S. PATENT DOCUMENTS

| | | | |
|---|---|---|---|
| 5,381,054 A | 1/1995 | Standley | |
| 6,005,810 A \* | 12/1999 | Wu | G11C 16/3418 365/185.08 |
| 8,271,672 B1 \* | 9/2012 | Zhang | H04L 47/522 709/231 |
| 2005/0063211 A1 \* | 3/2005 | Atallah | G11C 7/1045 365/145 |
| 2005/0165737 A1 \* | 7/2005 | Tomida | G06F 13/1605 |

(Continued)

FOREIGN PATENT DOCUMENTS

| | | |
|---|---|---|
| EP | 1492126 A1 | 12/2004 |
| WO | 2013017131 A2 | 2/2013 |
| WO | 2014113572 A1 | 7/2014 |

OTHER PUBLICATIONS

Kim, Y., "Energy Efficient and Error Resilient Neuromorphic Computing in VLSI." Texas A&M University Dissertation, Dec. 2013, 139 pages.

(Continued)

*Primary Examiner* — Khamdan Alrobaie
(74) *Attorney, Agent, or Firm* — Scully, Scott, Murphy & Presser, P.C.; Louis Percello, Esq.

(57) ABSTRACT

A system of processing a task based on information of frequently used algorithms learned through a memory unit includes a first memory, a second memory, a processor, and a reading unit. The processor processes a first type of task using a first algorithm, and writes to a first memory cell of the second memory. The second memory including first and second memory cells each having a charge storage element. The first and second memory cells correspond to the first and second algorithms, respectively. The reading unit senses a first voltage stored in the first memory cell and a second voltage stored in the second memory cell, and provides information of frequently used algorithms to the processing device based on the sensed first and second voltages.

20 Claims, 8 Drawing Sheets

(56) References Cited

U.S. PATENT DOCUMENTS

| | | |
|---|---|---|
| 2006/0184846 A1* | 8/2006 | Hillier, III .......... G06F 11/1666 714/718 |
| 2008/0262991 A1 | 10/2008 | Kapoor et al. |
| 2009/0119567 A1* | 5/2009 | Kawabata ........... G06F 11/1032 714/763 |
| 2012/0109866 A1 | 5/2012 | Modha |
| 2013/0046943 A1* | 2/2013 | Ono .................... G06F 12/0215 711/160 |
| 2014/0304004 A1 | 10/2014 | Trethewey |
| 2015/0339570 A1 | 11/2015 | Scheffler |

OTHER PUBLICATIONS

Naves, S.C., "IMPACT—Intelligent Memory Pool Assisted Cognition Tool: A Cueing device for the Memory Impaired", International Journal of Information Technology Convergence and Services (IJITCS), Apr. 2012, pp. 47-54, vol. 2, No. 2.

* cited by examiner

SMART MEMORY ANALOG DRAM

FIELD

The present disclosure generally relates to a cognitive computing technique, and more particularly, to a method of processing a task based on the cognitive computing technique and a system for performing the same.

BACKGROUND

Cognitive computing refers to the development of computer systems modeled after the human brain by teaching computers to think like a human brain.

When a computer is used to process various types of tasks such as image processing, pattern recognition, text recognition, etc, if the computer has no information about which kind of task is processed more than other, algorithms in the computer may have to be accessed in a specific order to process a task until the task is processed with a correct algorithm of the algorithms. However, this may lead wastes of processing resources and time.

If a computer is implemented on idea of the cognitive computing to learn which type of task is most likely processed, the computer may check first an algorithm which is most likely matched to process the task based on a learned result to reduce the taken processing resources and time.

Thus, a system for efficiently teaching the computer which algorithm should be checked at first based on information how frequently each algorithm is used for a given time is needed.

SUMMARY

In one aspect, there is provided a system of processing a task based on information of frequently used algorithms learned through a memory unit. The system includes a first memory unit, a second memory unit, a processing device, and a reading unit. The first memory unit includes a first algorithm used to process a first task of a first type and a second algorithm used to process a second task of a second type. The second memory unit includes a first memory cell having a first charge storage element and a second memory cell having a second charge storage element. The first and second memory cells correspond to the first and second algorithms, respectively. The processing device is configured to process the first task using the first algorithm, to provide a first write signal to the first memory cell of the second memory unit, and to write to the first memory cell in response to the first write signal. The reading unit is configured to sense a first voltage of the first charge storage element and a second voltage of the second charge storage element, and to provide the information of frequently used algorithms to the processing device based on the sensed first and second voltages. When the first voltage is higher than the second voltage, the processing device first accesses the first algorithm to process a second task subsequent to the first task according to the information of the frequently used algorithms.

In another aspect, there is provided a method of processing a task based on information of frequently used algorithms learned through a memory unit. The method includes processing a first task having a first type using a first algorithm stored in a first memory unit, providing a first write signal to a first memory cell of a second memory unit to write to the first memory cell, the first memory cell corresponding to the first algorithm, sensing a first voltage stored in the first memory cell and a second voltage stored in a second memory cell in the second memory unit, providing the information of frequently used algorithms to the processing device based on the sensed first and second voltages, and first accessing the first algorithm to process a second task subsequent to the first task according to the information of the frequently used algorithms when the first voltage is higher than the second voltage. The second memory cell corresponds to a second algorithm stored in the first memory unit.

Further, in another aspect, there is provided a computer program product for a method of processing a task based on information of frequently used algorithms learned through a memory unit. The computer program product is stored in a non-transitory computer-readable storage medium having computer readable program instructions. The computer readable program instructions are read and carried out by a processing device. The method includes processing a first task having a first type using a first algorithm stored in a first memory unit, providing a first write signal to a first memory cell of a second memory unit to write to the first memory cell, the first memory cell corresponding to the first algorithm, sensing a first voltage stored in the first memory cell and a second voltage stored in a second memory cell in the second memory unit, providing the information of frequently used algorithms to the processing device based on the sensed first and second voltages, and first accessing the first algorithm to process a second task subsequent to the first task according to the information of the frequently used algorithms when the first voltage is higher than the second voltage. The second memory cell corresponds to a second algorithm stored in the first memory unit.

DETAILED DESCRIPTION OF THE EMBODIMENTS

Like reference numerals may refer to like elements throughout the written descriptions and drawings.

Figure 1:
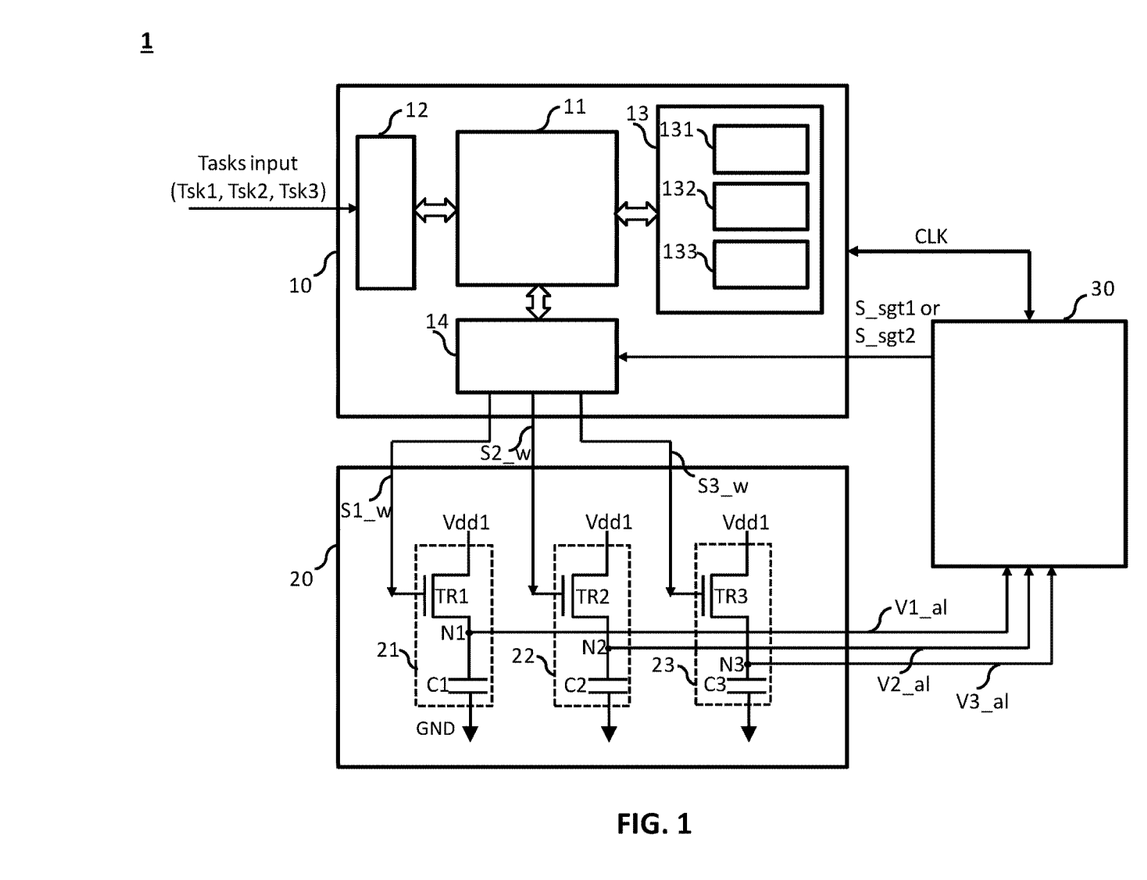
FIG. 1 is a block diagram of a system for processing a task based on information of frequently used algorithms learned through a memory unit according to a non-limiting exemplary embodiment of the present disclosure.
Figure 2A:
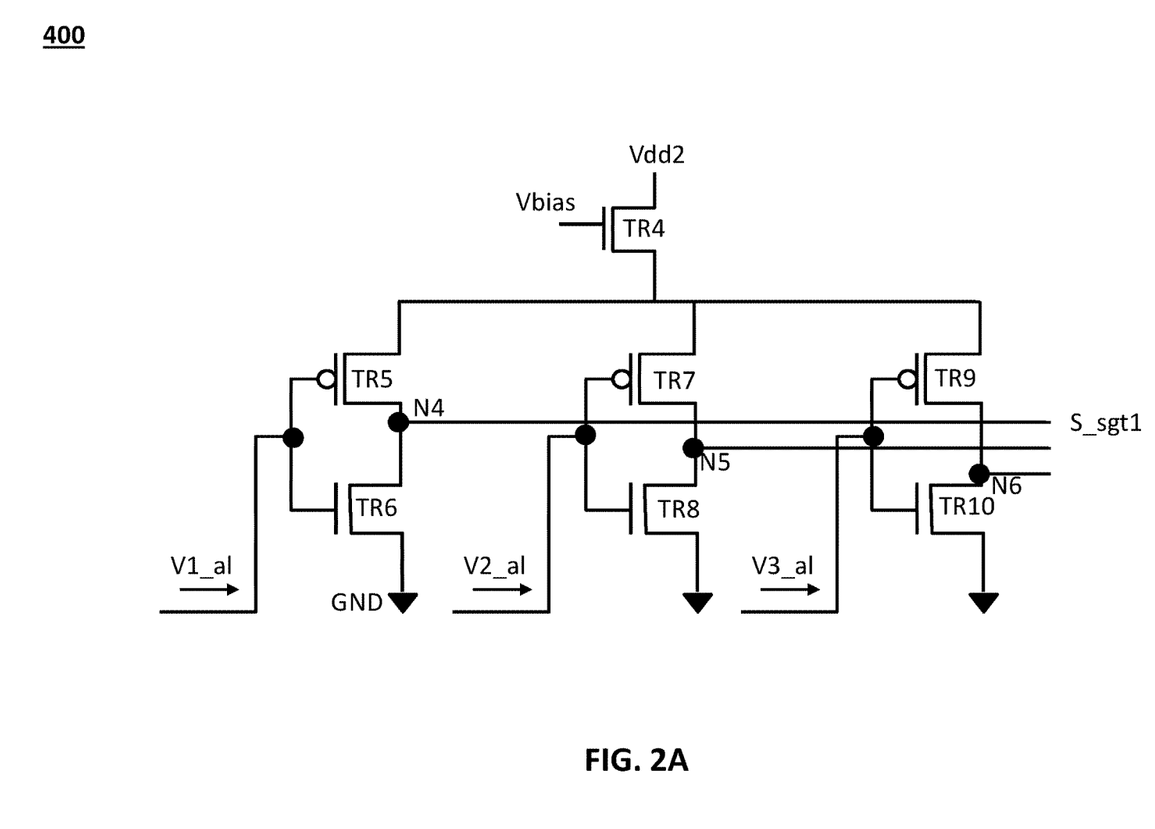
FIGS. 2A and 2B illustrate examples of a reading unit of the system of FIG. 1 according to a non-limiting exemplary embodiment of the present disclosure.
Figure 2B:
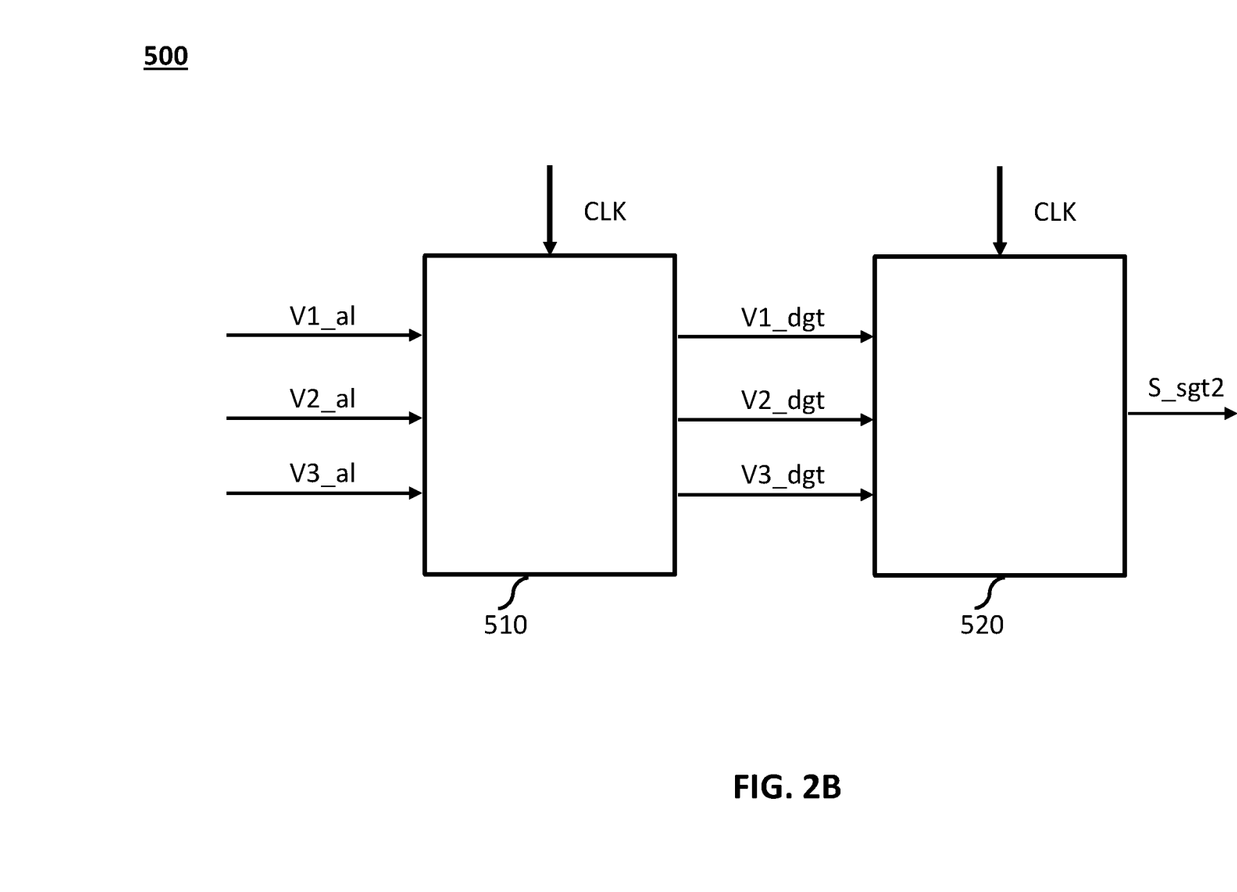
Figure 2C:
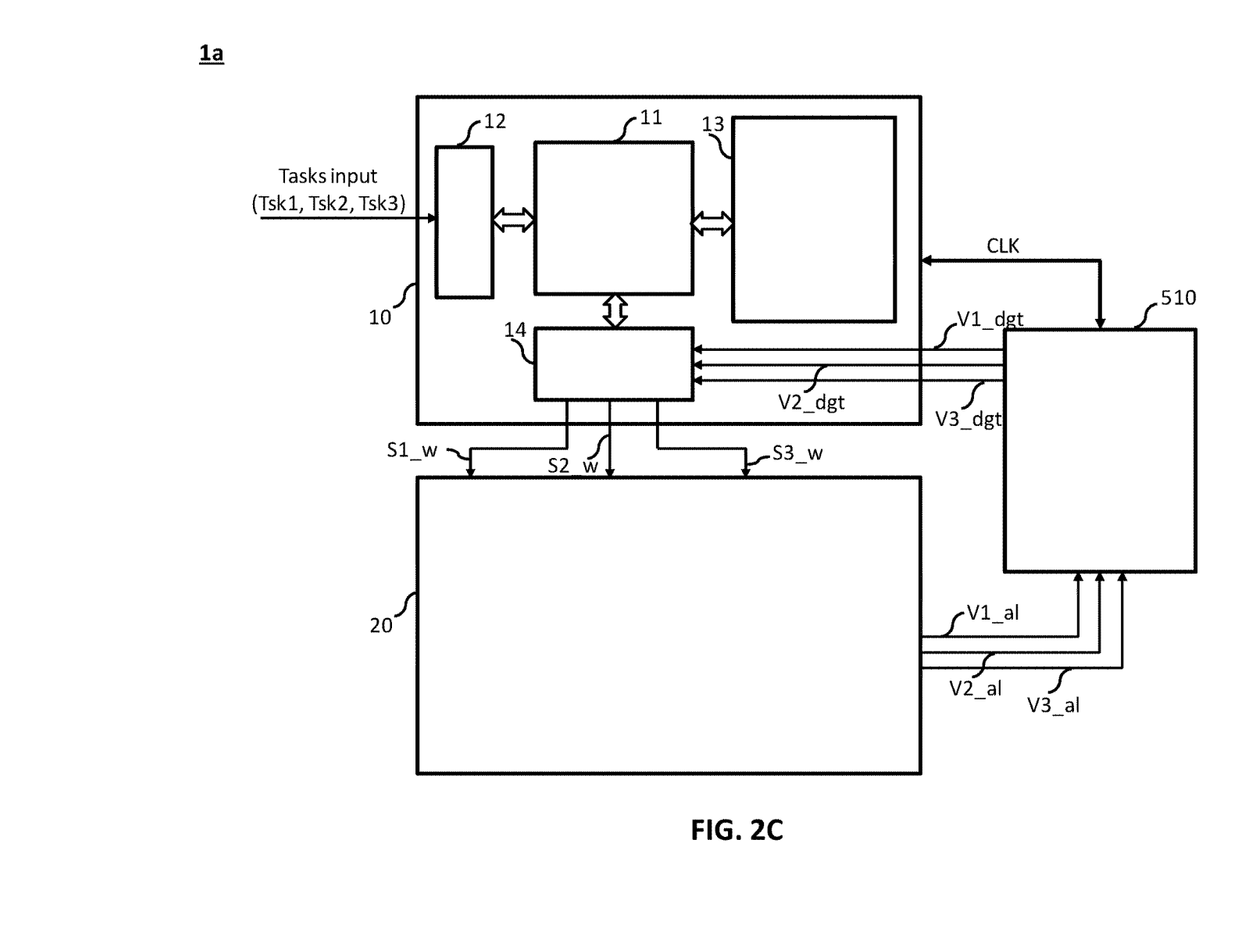
FIG. 2C is a block diagram of a system for processing a task based on information of frequently used algorithms learned through a memory unit according to a non-limiting exemplary embodiment of the present disclosure.

FIG. 1 is a block diagram of a system 1 for processing a task based on information of frequently used algorithms learned through a memory unit according to a non-limiting exemplary embodiment of the present disclosure. FIGS. 2A and 2B illustrate examples of a reading unit 30 of the system 1 of FIG. 1 according to a non-limiting exemplary embodiment of the present disclosure. FIG. 2C is a block diagram of a system 1a for processing a task based on information of frequently used algorithms learned through a memory unit according to a non-limiting exemplary embodiment of the present disclosure.

Referring to FIG. 1, the system 1 may include a computing device 10, the learning unit 20, and a reading unit 30. The computing device 10 may include a processor 11, a task receiving unit 12, a memory unit 13, and an input/output (I/O) interface 14.

The processor 11 may process various types of tasks including, but not limited to, image processing, pattern recognition, text recognition, etc. The types of tasks may vary depending on a type of an object to be processed. For example, in the image processing, recognition of a human face may be a different task from recognitions of other object such as a car, an animal, or the like. Throughout the present disclosure, the various types of tasks may be expressed as first to third types of tasks Tsk1 to Tsk3 for purpose of illustration, however the present disclosure is not limited thereto.

One or more tasks, each of which is one of the first to third types of tasks Tsk1 to Tsk3, may be input to the computing device 10 through the task receiving unit 12. For example, in an embodiment, the task receiving unit 12 may include, but not limited to, a camera, an electronic scanner, a disk drive, a network adaptor, or the like. The memory 13 may include first to third program modules each which correspond to one of first to third algorithms 131 to 133. When a certain task is input to the computing device 10, the processor 11 may access at least one of the algorithms 131 to 133 to process the input task. In an initial phase, since the computing device 10 has no information on which type of task is most frequently input (or on which algorithm is most frequently used to correspond to the task), it may access the first to third algorithms 131 to 133 in an arbitrary (or random) order until the input task is properly processed using a correct algorithm of the first to third algorithms 131 to 133.

The learning unit 20 may include first to third memory cells 21 to 23. Each of the first to third memory cells 21 to 23 may include a switching device and a capacitor. The switching device may be implemented with a transistor. For example, the transistor may be a bipolar junction transistor, a field effect transistor (FET), or the like. Although it is illustrated in FIG. 1 that the switching device (e.g., TR1, TR2, or TR3) is an n-channel FET, the present disclosure is not limited thereto, and for example, the switching device may be a p-channel FET.

The first memory cell 21 may include a first switching device TR1 and a first capacitor C1, the second memory cell 22 may include a second switching device TR2 and a second capacitor C2, and the third memory cell 23 may include a third switching device TR3 and a third capacitor C3. In each of the first to third memory cells 21 to 23, each switching device (e.g., TR1, TR2, or TR3) may have a first electrode connected to a voltage supply Vdd1, a second electrode connected to each capacitor (e.g., C1, C2, or C3), and a third electrode (e.g., a gate electrode) through which a write signal provided from the computing device 10 is input to control a switching operation of the switch device. Each capacitor may have a first electrode (e.g., N1, N2, or N3) connected to the second electrode of the switching device and a second electrode connected to a ground GND. In an embodiment, when the writing signal is input to the third electrode of the switching device (e.g., TR1, TR2, or TR3), the switching device may be closed and a current from the voltage supply Vdd1 may flow through the switching device to the capacitor, and thus, the capacitor may be charged.

When the computing device 10 successfully processes each task input through the task receiving unit 12, it may generate a corresponding one of first to third write signals S1_w to S3_w to write a corresponding one of the first to third memory cells 21 to 23. For example, when the computing device 10 processes a first type of task Tsk1 using the first algorithm 131, it may generate the first write signal S1_w to write the first memory cell 21 during an activation duration of the first write signal S1_w. Further, when the computing device 10 processes a second type of task Tsk2 using the second algorithm 132, it may generate the second write signal S2_w to write the second memory cell 22 during an activation duration of the second write signal S2_w. Still further, when the computing device 10 processes a third type of task Tsk3 using the third algorithm 133, it may generate the third write signal S3_w to write the third memory cell 23 during an activation duration of the third write signal S3_w. In an embodiment, the first to third write signals S1_w to S3_w may have the same activation duration and may be synchronized with a clock signal CLK. The activation duration of each of the first to third write signal S1_w to S3_w may be a single write time Tw for which a memory cell is written in response to one time usage to a corresponding algorithm. As described above, hereinafter, the terms "writing to a memory cell" and "reading from a memory cell" may be understood to mean as "charging a capacitor of the memory cell" and "sensing a voltage charged in the capacitor of the memory cell", respectively.

In an embodiment, each capacitor is not fully charged for the activation duration, but charged by a fraction of the full charge amount thereof. For example, the full charge amount Qf of the capacitor may correspond to a value of multiplying a unit charge amount Qw stored in the capacitor per one time write to the memory cell by "K" (e.g., Qf=K×Qw). Here, "K" is an integer of at least one and the symbol "x" denotes multiplication. Thus, each memory cell may function as an analog memory cell (e.g., analog dynamic random access memory (DRAM) cell of capable of storing K levels of analog voltages. A person of ordinary skill in the art may understand that a voltage is obtained by dividing a charge amount by a capacitance.

In a non-limiting example, if the single write time Tw, a write current Iw supplied to a capacitor per the write time Tw, and a capacitance Cap of the capacitor are 1 ns, 1 μA, and 100 fF, respectively, the unit charge amount Qw stored in the capacitor during the write time Tw may be $1 \times 10^{-15}$ coulombs and thus, "K" may be 100, considering that an electric charge amount Qf of the fully charged capacitor is $1 \times 10^{-13}$ coulombs at, e.g., Vdd=1 V.

Here, the write time Tw, the write current Iw, the capacitance Cap may be set to adjust the variable "K", which is the number of analog voltage levels can be stored in each memory cell. For example, "K" (or the number of analog voltage levels stored in each memory cell) may be increased by decreasing the write time Tw and/or the write current Iw or by increasing the capacitance Cap.

The reading unit 30 may read (or sense) stored analog voltage levels V1_al to V3_al of the respective first to third memory cell 21 to 23 from the learning unit 2 and provide information of frequently used algorithms to the computing device 10 based on the sensed first to third voltages V1_al to V3_al.

In an embodiment, the information of frequently used algorithms may be a suggest algorithm (e.g., a most frequently used algorithm). To this end, the reading unit 30 may generate a signal corresponding to a highest one of the analog voltages V1_al to V3_al by comparing the analog voltages V1_al to V3_al one with another to provide the computing device 10. Here, the signal corresponding to a highest one of the analog voltages V1_al to V3_al may be referred to as a suggest signal S_sgt1 which represents a suggest algorithm which the computing device 10 first accesses to process a next task Tsk_next.

In an embodiment, the reading unit 30 may include a voltage comparison unit which compares the analog voltages V1_al to V3_al provided from the learning unit 20 and output the suggest signal S_sgt1 corresponding to a highest one of the analog voltages V1_al to V3_al.

In an early phase of this mechanism, since the number of samples accumulatively stored in the learning unit 20 is not high enough, the suggest algorithm might not be matched with a next task Tsk_next to be processed. However, the higher the number of stored samples, the more likely the suggest algorithm becomes matched with the next task Tsk_next.

For example, if the suggest algorithm is the first algorithm 131 and the next task Tsk_next is the first type of task Tsk1, the suggest algorithm may be matched with the next task Tsk_next. Thus, the computing device 10 may be able to process the next task Tsk_next using the first algorithm 131 and provide the first write signal S1_w for the first memory cell 21 to be written. On the other hand, if the next task Tsk_next is not the first type of task Tsk1, but, e.g., the second or third type of task Tsk2 or Tsk3, the suggest algorithm might not be matched with the next task Tsk_next. In this scenario, the computing device 10 may fail to process the next task Tsk_next using the first algorithm 131, then may access either of the second or third algorithm 132 or 133 to process the next task Tsk_next and provide a second or third write signal S2_w or S3_w for either of the second or third memory cell 22 or 23 to be written. However, the present disclosure is not limited to the example described above.

In an embodiment, the reading unit 30 may be implemented with a voltage comparator 400 as shown in FIG. 2A. The voltage comparator 400 may include fourth to tenth FETs TR4 to TR10. The fourth, sixth, eighth, and tenth FETs TR4, TR6, TR8, and TR10 may be n-channel FETs, and fifth, seventh, and ninth FETs TR5, TR7, and TR9 may be p-channel FETs. The fourth FET TR4 may include a first electrode (e.g., drain electrode) connected to a second voltage supply Vdd2, a second electrode (e.g., source electrode) connected to the fifth, seventh, and ninth FETs TR5, TR7, and TR9, and a gate electrode to which a bias voltage Vbias is applied.

The fifth FET TR5 may include a first electrode (e.g., source electrode) connected to the second electrode of the fourth FET TR4, a second electrode (e.g., drain electrode) connected to a first electrode (e.g., drain electrode) of the sixth FET TR6 through node 4 N4, and a gate electrode. The sixth FET TR6 may include the first electrode, a second electrode (e.g., source electrode) connected to the ground GND, and a gate electrode.

Similar to the fifth FET TR5, the seventh FET TR7 may include a first electrode (e.g., source electrode) connected to the second electrode of the fourth FET TR4, a second electrode (e.g., drain electrode) connected to a first electrode (e.g., drain electrode) of the eighth FET TR8 through node 5 N5, and a gate electrode. The eighth FET TR8 may include the first electrode, a second electrode (e.g., source electrode) connected to the ground GND, and a gate electrode.

Similar to the fifth FET TR5, the ninth FET TR9 may include a first electrode (e.g., source electrode) connected to the second electrode of the fourth FET TR4, a second electrode (e.g., drain electrode) connected to a first electrode (e.g., drain electrode) of the tenth FET TR10 through a node 6 N6, and a gate electrode. The tenth FET TR10 may include the first electrode, a second electrode (e.g., source electrode) connected to the ground GND, and a gate electrode.

In addition, the first analog voltage V1_al sensed from the first memory cell 21 may be applied to the gate electrodes of the fifth and sixth FETs TR5 and TR6. The second analog voltage V2_al sensed from the second memory cell 22 may be applied to the gate electrodes of the seventh and eighth FETs TR7 and TR8. The third analog voltage V3_al sensed from the third memory cell 23 may be applied to the gate electrodes of the ninth and tenth FETs TR9 and TR10.

The voltage comparator 400 may output the suggest signal S_sgt1 through a corresponding one of the nodes 4 to 6 N4 to N6, and ninth FETs TR5, TR7, and TR9 by comparing the analog voltages V1_al to V3_al one with another. For example, when the first analog voltage V1_al is higher than each of the second and third analog voltages V2_al and V3_al, the suggest signal S_sgt1 may be output through the node 4 N4 and thus, the computing device 10 may determine that the first algorithm 131 is a most frequently used algorithm. When the second analog voltage V2_al is higher than each of the first and third analog voltages V1_al and V3_al, the suggest signal S_sgt1 may be output through the node 5 N5 and thus, the computing device 10 may determine that the second algorithm 132 is a most frequently used algorithm. When the third analog voltage V3_al is higher than each of the first and second analog voltages V1_al and V2_al, the suggest signal S_sgt1 may be output through the node 6 N6 and thus, the computing device 10 may determine that the third algorithm 133 is a most frequently used algorithm.

In an embodiment, the information of frequently used algorithms may be a suggest access order to the first to third algorithms 131 to 133. The reading unit 30 may read (or sense) stored analog voltage levels V1_al to V3_al of the respective first to third memory cells 21 to 23 from the learning unit 20 and determine the suggest access order to the algorithms 131 to 133, so that the computing device 10 access the algorithms 131 to 133 according the suggest access order to process a next task T_next.

In an embodiment, the reading unit 30 may be implemented with a reading system 500 including an analog-to-digital converter (ADC) 510 as shown in FIG. 2B. The ADC 500 may convert each of the analog voltages V1_al to V3_al provided from the learning unit 20 to each of digital voltage values V1_dgt to V3_dgt. The system 500 may further include a processor 520 as shown in FIG. 2B which receives the converted digital voltage values V1_dgt to V3_dgt, determines the suggest access order to the algorithms 131 to 133 based on the converted digital voltage values V1_dgt to V3_dgt, and provides the computing device 10 with a suggest signal S_sgt2 including the determined suggest access order.

As described above, since each of the memory cells 21 to 23 is capable of storing K levels for each analog voltage, each analog voltage (e.g., V1_al, V2_al, or V3_al) may be one of "K+1" levels. For example, each analog voltage may be one of first to (K+1)-th levels. Here, the first level may correspond to a case of that there is no stored charge in the corresponding memory cell and the (K+1)-th voltage level may correspond to a case of that the corresponding memory cell is fully charged.

Further, each of the first to (K+1)-th levels may be converted to a corresponding digital voltage value through the ADC 510. For example, each digital voltage value converted from each of the first to (K+1)-th levels may be encoded in at least i bits (e.g., $2^i \geq K$), however, the present disclosure is not limited thereto. Here, "i" is an integer of at least one.

Referring back to FIG. 2B, the processor 520 may receive the first to third digital values V1_$dgt$ to V3_$dgt$ each which is encoded in i bits, determine the suggest access order based on the first to third digital voltage values V1_$dgt$ to V3_$dgt$, and provide the computing device 10 with the suggest signal S_sgt2 including information of the suggest access order. In order to process a next task Tsk_next, the computing device 10 may access the first to third algorithms 131 to 133 stored in the memory 13 according to the suggest access order.

For example, as in the example described hereinabove in paragraph [0025], if "K" is 100, each analog voltage may be one of first (or 1st) to one hundred and first (101st) levels and may be converted to a digital voltage value. In this case, the digital voltage value may be encoded in at least seven bits since the number of levels expressed by the 7 bits is 128 which is greater than the total number of levels (e.g., (K+1)=101) of each analog voltage. Further, for a given time period, if the first type of task Tsk1 is processed using the first algorithm 131 by 50 times, then a first charge amount C1_strd stored in the first capacitor C1 may be 50 times the unit charge amount Qw (e.g., C1_strd=50×Qw); if the second type of task Tsk2 is processed using the second algorithm 132 by 30 times, then a second charge amount C2_strd stored in the second capacitor C2 may be 30 times the unit charge amount Qw (e.g., C2_strd=30×Qw); and if the third type of task Tsk3 is processed using the third algorithm 133 by 20 times, then a third charge amount C3_strd stored in the third capacitor C3 may be 20 times the unit charge amount Qw (e.g., C3_strd=20×Qw).

Accordingly, the ADC 510 may convert the first analog voltage V1_al corresponding to the first charge amount C1_strd to a first digital voltage value of, e.g., "0110010"; the ADC 510 may convert the second analog voltage V2_al corresponding to the second charge amount C2_strd to a second digital voltage value of, e.g., "0011110"; and the ADC 510 may convert the third analog voltage V3_al corresponding to the third charge amount C3_strd to a third digital voltage value of, e.g., "0010100". Thus, the processor 520 may determine the suggest access order to be the first algorithm 131→the second algorithm 132→the third algorithm 133 by decoding the first to third digital voltage values V1_$dgt$ to V3_$dgt$. However, the above exemplary embodiments are provided only for illustrative purposes and the present disclosure is not limited thereto.

In an embodiment, as shown in FIG. 2C, the processor 520 might not be included in the system 500 of FIG. 2B, but rather the above-described functions of the processor 520 may be implemented in the computing device 10 (e.g., more particularly in the processor 11). The system 1a shown in FIG. 2C may have substantially the same configuration as that of FIG. 1 except that the ADC 510 senses the first to third analog voltages V1_al to V3_al and provides the corresponding converted digital voltage values V1_$dgt$ to V3_$dgt$ to the computing device 10 (e.g., more particularly to the I/O device 14). Although it is illustrated in FIG. 2C that the digital voltage values V1_$dgt$ to V3_$dgt$ are provided to the computing device 10 through parallel wired lines, the present disclosure is not limited thereto, and they may be provided through a serial wired line.

In an embodiment, each memory cell (e.g., 21, 22, or 23) may have a "forgotten" feature, so that a corresponding capacitor of each memory cell may lose (or discharge) a charge amount (e.g., a unit charge amount Qw) corresponding to one time write to the memory cell every a preset number of clock cycles of the clock signal CLK. If the capacitor does not lose the charges, each capacitor may be fully charged at a certain time and the memory cell may no longer be written. Hereinafter, a "forget rate" R_frg may represent to how fast a memory cell loses (or forget) the charges.

The forget rate R_frg of a memory cell may be determined by a ratio of on and off resistances (hereinafter, referred to as an "on-and-off resistance ratio R) of a transistor in the memory cell. For example, the higher the on and off resistance ratio R, the slower the forget rate R_frg.

For example, if the on-and-off resistance ratio R is "one", the memory cell may be charged and discharged with the same speed. If the on-and-off resistance ratio R is "ten", the memory cell may be discharged ten times slower than being charged. Further, the on-and-off resistance ratio R may be adjusted by adjusting various parameters of the transistor (e.g., TR1, TR2, or TR3), such as a threshold voltage, a back bias voltage, a gate leakage current, etc, through various fabrication techniques.

Figure 3:
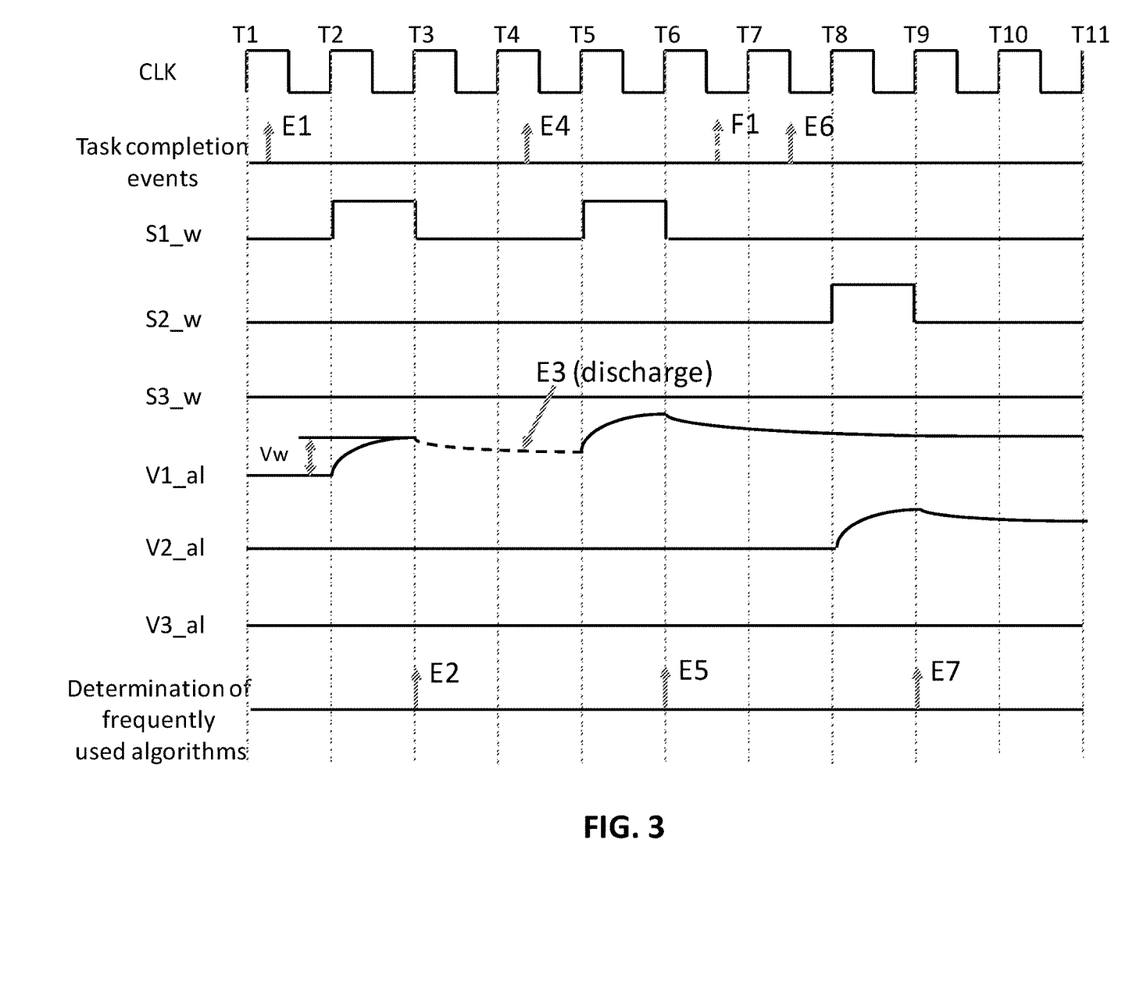
FIG. 3 illustrates a timing diagram of operating the system of FIG. 1 according to a non-limiting exemplary embodiment of the present disclosure.

FIG. 3 illustrates a timing diagram of operating the system 1 of FIG. 1 according to a non-limiting exemplary embodiment of the present disclosure.

Referring back to FIG. 1, the system 1 may further include a clock generator 40 which generates the clock signal CLK to synchronize operations of the computing device 10, the learning unit 20, and the reading unit 30 one with another.

Referring to FIGS. 1 and 3, it is assumed that first to third tasks Tsk1_in to Tsk3_in are input to the computer device 10. For example, the first and second input tasks Tsk1_in and Tsk2_in may be the first type of Tsk1, and the third input task Tsk3_in may be the second type of task Tsk2. However, the examples shown in FIG. 3 are presented for purpose of illustration and description, however the present disclosure is not limited thereto.

Referring to FIG. 3, in an initial phase, when the first task Tsk1_in which is the first type of task Tsk1 is input to the computing device 10, since the computing device 10 has no information on which type of task is most likely input, it may access the first to third algorithms 131 to 133 in an arbitrary (or random) order until the first input task Tsk1_in is properly processed using a correct algorithm of the first to third algorithms 131 to 133. Thus, the computing device 10 may end up able to process the first input task Tsk1_in in an event E1 using the first algorithm 131. The computing device 10 may provide the first write signal S1_w to the first memory cell 21 in response to completion of the first input task Tsk1_in using the first algorithm 131. Here, the first write signal S1_w may be generated in synchronization with the clock signal CLK. For example, the first write signal S1_w may begin a logic high state at a rising edge (e.g., T2) of the clock signal CLK for one cycle of the clock signal CLK.

During the logic high state of the first write signal S1_w, the first capacitor C1 may be charged and thus, the first analog voltage V1_al may be a unit charge voltage Vw (e.g., 1Vw) at T3. Further, the first capacitor C1 may begin to discharge during a period between T3 and T5 according to the above-described forget rate R_frg in an event E3. The unit charge voltage Vw may be calculated by Vw=Qw/C; here C is a capacitance of the first capacitor. At this time, since the second and third memory cells 22 and 23 have not been written, the second and third analog voltages V2_al and V3_al may be zero or substantially zero.

As described above, the reading unit 30 may sense the first to third analog voltages V1_al to V3_al to determine the suggest algorithm in the embodiment described with reference to FIG. 2A.

In the embodiment described with reference to FIG. 2A, the reading unit 30 may determine the first algorithm 131 as the suggest algorithm in an event E2 since the first analog voltage V1_al is higher than other analog voltages V2_al and V3_al. Next, the computing device 10 may first access the first algorithm 131 to process the second input task Tsk2_in.

In an event E4, the computing device 10 may end up able to process the second input task Tsk2_in using the first algorithm 131. The computing device 10 may provide the first write signal S1_w to the first memory cell 21 in response to completion of the first input task Tsk1_in using the first algorithm 131. Here, the first write signal S1_w may begin a logic high state at a rising edge (e.g., T5) of the clock signal CLK for one cycle thereof.

During the logic high state of the first write signal S1_w, the first capacitor C1 may be charged again by the unit charge voltage Vw. Thus, at T6, the first analog voltage V1_al may reach a value of subtracting an amount of discharged voltage V1_dsc during the period from T3 to T5 from the two times the unit charge voltage (e.g., At T6, V1_al=2Vw−V1_dsc).

Next, the reading unit 30 may determine the first algorithm 131 as the suggest algorithm in an event E5 since the first analog voltage V1_al is higher than the other analog voltages V2_al and V3_al. The computing device 10 may first access the first algorithm 131 to process the third input task Tsk3_in. At this time, since the third input task Tsk3_in is not the first type of task Tsk1, in an event F1, the computing device 10 may fail to process the third input task Tsk3_in using the first algorithm 131 which is the suggested algorithm and end up able to process the third input task Tsk3_in using the second algorithm 132 in an event E6. Thus, the computing device 10 may provide the second write signal S2_w to the second memory cell 22 at T8.

During the logic high state of the second write signal S2_w, the second capacitor C2 may be charged by the unit charge voltage Vw. Thus, at T9, the second analog voltage V2_al may reach a value of the unit charge voltage.

Next, the reading unit 30 may determine the first algorithm 131 as the suggest algorithm (e.g., a most frequently used algorithm) in an event E7 since the first analog voltage V1_al is higher than the other analog voltages V2_al and V3_al.

As described above, the reading unit 30 may sense the first to third analog voltages V1_al to V3_al to determine the suggest access order to the first to third algorithms 131 to 133 in the embodiment described with reference to FIG. 2B.

Descriptions for the embodiment with respect to FIG. 2B are substantially the same as the embodiment with respect to FIG. 2A except for determining the suggest access order at the events of E2, E5, and E7 of FIG. 3. Thus, duplicate descriptions will be omitted.

Figure 4A:
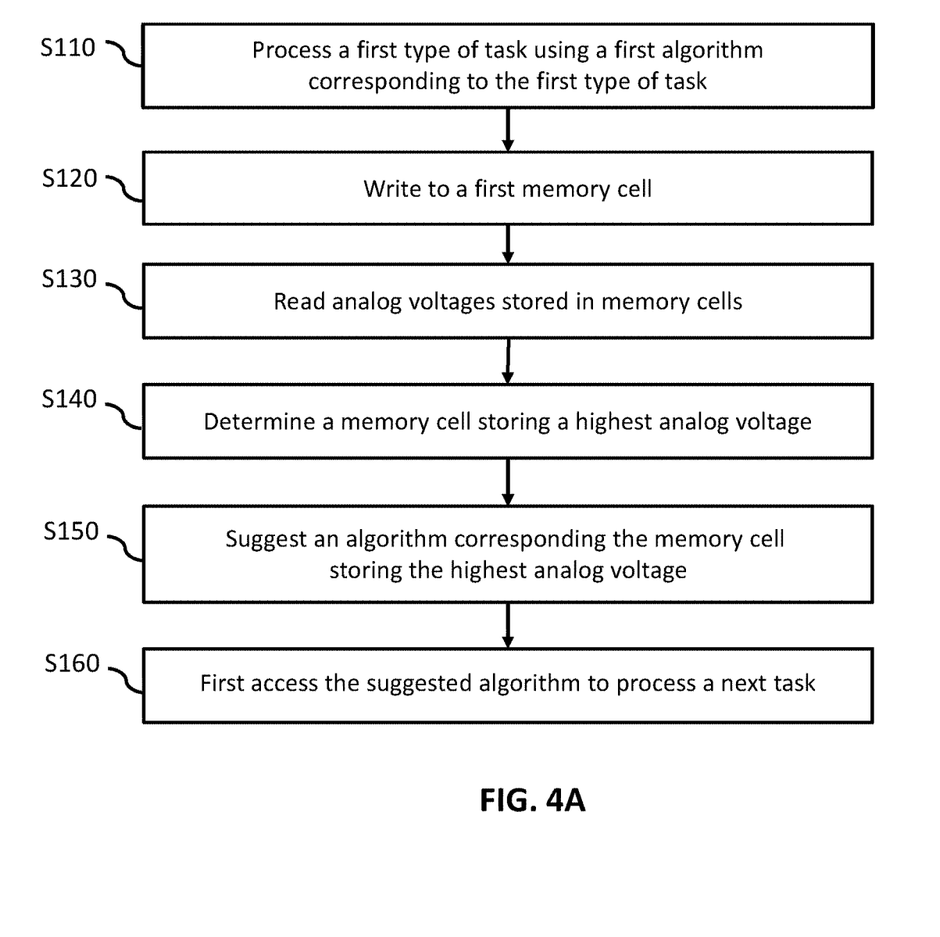
FIG. 4A is a flow chart illustrating a method of determining a suggest algorithm and processing a task based on the suggest algorithm, according to a non-limiting exemplary embodiment of the present disclosure.

FIG. 4A is a flow chart illustrating a method of determining a suggest algorithm and processing a task based on the suggest algorithm, according to a non-limiting exemplary embodiment of the present disclosure.

Although not shown in FIG. 4A, the computing device 10 may input a certain task through the task receiving unit 12, access the first to third algorithms 131 to 133 stored in the memory 13 in a specific order or an arbitrary order to process the input task, and end up able to process the input task using a corresponding algorithm of the first to third algorithms 131 to 133.

If the input task is a first type of task Tsk1, the computing device 10 may process the input task using the first algorithm 131 corresponding to the first type of task Tsk1 in an operation S110 and may write to the first memory cell 21 in an operation S120. The writing to the first memory cell 21 may include providing the first write signal S1_w and charging the first capacitor C1 during an activation period of the first write signal S1_w to store usage information of the first algorithm 131 in the first memory cell 21. In addition, the reading unit 30 may read the first to third analog voltages V1_al to V3_al respectively stored in the first to third memory cells 21 to 23 in an operation S130 and determine a memory cell which stores a highest analog voltage in an operation S140. At this time, the memory cell which stores the highest analog voltage may be the first memory cell 21 and the highest analog voltage may be the first analog voltage V1_al since the other memory cells 22 and 23 are not charged.

In addition, the reading unit 30 may determine a suggest algorithm which corresponds to the first memory cell 21 storing the highest analog voltage V1_al and the reading unit 30 may further include providing a suggest signal S_sgt1 including the suggest algorithm to the computing device 10 in an operation S150.

The computing device 10 may receive the suggest signal S_sgt1 and first access the suggest algorithm (e.g., the first algorithm 131) to process a next task in an operation S160.

Although FIG. 4A illustrates that a case where only the first type of task Tsk1 is processed, the first memory cell 21 is charged, and the first algorithm 131 is determined as a suggest algorithm, the present disclosure is not limited thereto, and for example, arbitrary type of task (e.g., Tsk2 or Tsk3) may be processed, and in response to this, other memory cells 22 and 23 may be charged and other algorithms 132 and 133 may be determined as the suggest algorithm.

Figure 4B:
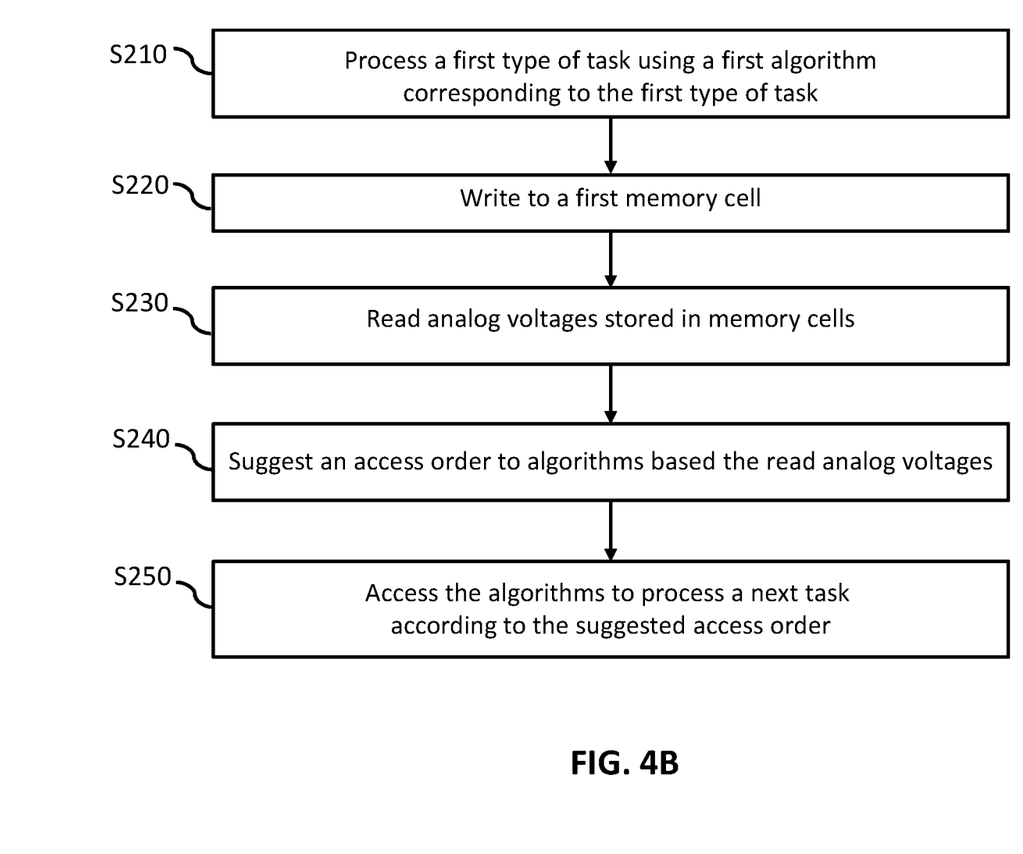
FIG. 4B is a flow chart illustrating a method of determining a suggest access order and processing a task based on the suggest access order, according to a non-limiting exemplary embodiment of the present disclosure.

FIG. 4B is a flow chart illustrating a method of determining a suggest access order and processing a task based on the suggest access order, according to a non-limiting exemplary embodiment of the present disclosure.

Although not shown in FIG. 4B, the computing device 10 may input a certain task through the task receiving unit 12, access the first to third algorithms 131 to 133 stored in the memory 13 in a specific order or an arbitrary order to process the input task, and end up able to process the input task using a corresponding algorithm of the first to third algorithms 131 to 133.

If the input task is a first type of task Tsk1, the computing device 10 may process the input task using the first algorithm 131 corresponding to the first type of task Tsk1 in an operation S210 and may write to the first memory cell 21 in an operation S220. The writing to the first memory cell 21 may include providing the first write signal S1_w and charging the first capacitor C1 during an activation period of the first write signal S1_w to store access information in the first memory cell 21. In addition, the reading unit 30 may read the first to third analog voltages V1_al to V3_al respectively stored in the first to third memory cells 21 to 23 in an operation S230.

In addition, the reading unit 30 may convert the analog voltages V1_al to V3_al to digital voltages V1_dgt to V3_dgt, respectively (not shown in FIG. 4B) and suggest an access order to the algorithms 131 to 133 to the computing device 10 based on the values of the digital voltages V1_dgt to V3_dgt in an operation S240. Alternatively, the function of determining and suggesting the access order to the algorithms 131 to 133 may be implemented in the computing device 10, as described above.

In addition, the computing device 10 may access the algorithms 131 to 133 to process a next task according to the suggest access order in an operation S250.

Although FIG. 3 illustrates that a write signal (e.g., S1_w, S2_w, or S3_w) is activated to a high logic state at a first rising edge of the clock signal CLK after a completion of a corresponding task in an event E1, E4, or E6, the above exemplary embodiments are provided only for illustrative purposes and the present disclosure is not limited thereto, and the write signal of the present disclosure may be activated at any time after the completion of the task.

Further, although FIG. 3 illustrates that the reading unit 30 determines a suggest algorithm or a suggest access order in response to every single write to a memory cell in the events E2, E5, and E7, the above exemplary embodiments are provided only for illustrative purposes and the present disclosure is not limited thereto, and the reading unit 30 determines a suggest algorithm or a suggest access order every preset number P of writes to the memory cell. Here, "P" is an integer of at least one.

Although only the three types of tasks Tsk1 to Tsk3, corresponding three algorithms 131 to 133, and corresponding memory cells 21 to 23 are illustrated in FIGS. 1, 2A-2C, 3, 4A and 4B, the above exemplary embodiments are provided only for illustrative purposes and the number of types of tasks, the number of algorithms, and the number of memory cells of the present disclosure are not limited thereto.

Although each of the first to third memory cells 21 to 23 are illustrated to be implemented with a switching device and a capacitor in FIGS. 1 and 2C, exemplary embodiments of the present disclosure are not limited thereto. For example, each capacitor of the first to third memory cells 21 to 23 may be replaced by, but not limited to, a charge storage element to which charges are stored in response to an activation (e.g., logic high state) of a corresponding one of the first to third write signals S1_w to S3_w. For example, each of the first to third memory cells 21 to 23 may be implemented with, but not limited to, floating gate, magnetic based memory, phase change memory, etc.

Figure 5:
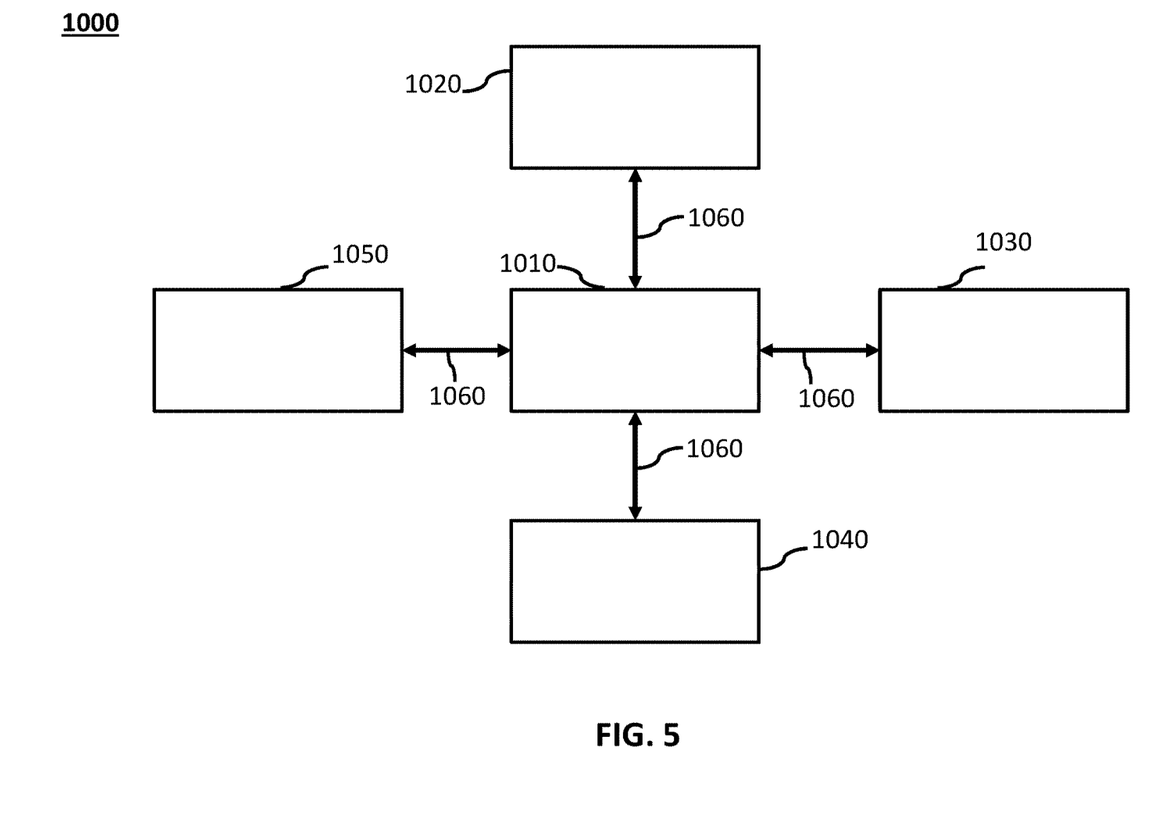
FIG. 5 is a block diagram of a computing system according to a non-limiting exemplary embodiment of the present disclosure.

FIG. 5 is a block diagram of a computing system 1000 according to a non-limiting exemplary embodiment of the present disclosure.

Referring to FIG. 5, the computing system 1000 may be used as a platform for performing the functions or operations described hereinabove with respect to the system 1 of FIG. 1 and/or the methods of FIGS. 4A and 4B.

In addition, the computing system 1000 may be implemented with a ultra-mobile personal computer (UMPC), a net-book, a personal digital assistance (PDA), a portable computer (PC), a web tablet, a wireless phone, a mobile phone, a smart phone, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, or the like.

Referring to FIG. 5, the computing system 1000 may include a processor 1010, I/O devices 1020, a memory system 1030, a display device 1040, and a network adaptor 1050.

The processor 1010 may drive the I/O devices 1020, the memory system 1030, the display device 1040, and the network adaptor 1050 through a bus 1060.

The computing system 1000 may include a program module for performing the functions or operations described hereinabove with respect to the system 1 of FIG. 1 or the methods of FIGS. 4A and 4B according to exemplary embodiments. For example, the program module may include routines, programs, objects, components, logic, data structures, or the like, for performing particular tasks or implement particular abstract data types. The processor (e.g., 1010) of the computing system 1000 may execute instructions written in the program module to perform the functions or operations described with respect to the system 1 of FIG. 1 or the methods of FIGS. 4A and 4B. The program module may be programmed into the integrated circuits of the processor (e.g., 1010). In an exemplary embodiment, the program module may be stored in the memory system (e.g., 1030) or in a remote computer system storage media.

The computing system 1000 may include a variety of computing system readable media. Such media may be any available media that is accessible by the computer system (e.g., 1000), and it may include both volatile and non-volatile media, removable and non-removable media.

The memory system (e.g., 1030) can include computer system readable media in the form of volatile memory, such as random access memory (RAM) and/or cache memory or others. The computer system (e.g., 1000) may further include other removable/non-removable, volatile/non-volatile computer system storage media.

The computer system (e.g., 1000) can communicate with one or more devices using the network adapter (e.g., 1050). The network adapter may support wired communications based on Internet, local area network (LAN), wide area network (WAN), or the like, or wireless communications based on code division multiple access (CDMA), global system for mobile communication (GSM), wideband CDMA, CDMA-2000, time division multiple access (TDMA), long term evolution (LTE), wireless LAN, Bluetooth, or the like.

Exemplary embodiments of the present disclosure may include a system, a method, and/or a computer program product. The computer program product may include a non-transitory computer readable storage medium (e.g., the memory system 1030) having computer readable program instructions thereon for causing a processor to carry out aspects of the present disclosure.

The computer readable storage medium can be a tangible device that can retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, or the like, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to the computing system 1000 from the computer readable storage medium or to an external computer or external storage device via a network. The network may include copper transmission cables, optical transmission fibers, wireless transmission, routers, firewalls, switches, gateway computers and/or edge servers. A network adapter card (e.g., 1050) or network interface in each computing/processing device receives computer readable program instructions from the network and forwards the computer readable program instructions for storage in a computer readable storage medium within the computing system.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the computing system (e.g., 1000) through any type of network, including a LAN or a WAN, or the connection may be made to an external computer (for example, through the Internet using an Internet Service Provider). In an exemplary embodiment, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, device, and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description, but is not intended to be exhaustive or limited to the present disclosure in the form disclosed. Many modifications and variations will be apparent to those of ordinary skill in the art without departing from the scope and spirit of the present disclosure. The embodiment was chosen and described in order to best explain the principles of the present disclosure and the practical application, and to enable others of ordinary skill in the art to understand the present disclosure for various embodiments with various modifications as are suited to the particular use contemplated.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A system of processing a task based on information of frequently used algorithms learned through a memory unit, comprising:
 a first memory unit including a first algorithm used to process a first task of a first type and a second algorithm used to process a second task of a second type;
 a second memory unit including a first memory cell having a first charge storage element and a second memory cell having a second charge storage element, wherein the first and second memory cells correspond to the first and second algorithms, respectively;
 a processing device configured to process the first task using the first algorithm, to provide a first write signal to the first memory cell of the second memory unit, and to write to the first memory cell in response to the first write signal; and
 a reading unit configured to sense a first voltage of the first charge storage element and a second voltage of the second charge storage element, and to provide the information of frequently used algorithms to the processing device based on the sensed first and second voltages,
 wherein when the first voltage is higher than the second voltage, the processing device first accesses the first algorithm to process a next task subsequent to the first task according to the information of the frequently used algorithms.

2. The system of claim 1, wherein the information of frequently used algorithms comprises a suggest algorithm corresponding to a most frequently used algorithm in the system, and
 wherein the suggest algorithm is the first algorithm.

3. The system of claim 1, wherein the first memory unit further comprises a third algorithm used to a third task of a third type, the second memory unit further comprises a third memory cell corresponding to the third algorithm, and the third memory cell includes a third charge storage element,
 wherein the reading unit configured to further sense a third voltage of the third charge storage element, and
 wherein the information of frequently used algorithms comprises a suggest access order to the first to third algorithms.

4. The system of claim 3, wherein the suggest access order is determined according to an order of magnitudes of the sensed first to third voltages.

5. The system of claim 1, wherein the reading unit comprises a voltage comparator configured to receive the first and second voltages, and to output the first voltage by comparing the first and second voltages with each other.

6. The system of claim 1, wherein the reading unit comprises an analog-to-digital converter (ADC) configured to receive the first and second voltages, and to convert the first and second voltages to first and second digital voltage values, respectively.

7. The system of claim 1, wherein the first charge storage element includes a first capacitor, and the second charge storage element includes a second capacitor.

8. The system of claim 7, wherein the first memory cell further includes a first switching device for a write control to the first capacitor based on the first write signal, and the second memory cell further includes a second switching device for a write control to the second capacitor based on the second write signal, and
 wherein each of the first and second switching devices has one electrode connected to a first voltage supply and another electrode connected to a corresponding one of the first and second capacitors, and each of the first and second capacitors has one electrode connected to the another electrode of each of the first and second switching devices and another electrode connected to a ground.

9. The system of claim 1, wherein a magnitude of the first voltage is decreased by a value corresponding to one write to the first memory cell every a preset number of cycles of a clock signal.

10. The system of claim 9, wherein the first memory cell further includes a first switching device connected between a first power supply and the first charge storage element,
 wherein the preset number of cycles is controlled by adjusting a ratio of an on-state resistance and an off-state resistance of the first switching device.

11. A method of processing a task based on information of frequently used algorithms learned through a memory unit, comprising:
 processing a first task of a first type using a first algorithm stored in a first memory unit;
 providing a first write signal to a first memory cell of a second memory unit to write to the first memory cell, the first memory cell corresponding to the first algorithm;
 sensing a first voltage stored in the first memory cell and a second voltage stored in a second memory cell in the second memory unit;
 providing the information of frequently used algorithms to the processing device based on the sensed first and second voltages; and
 first accessing the first algorithm to process a second task subsequent to the first task according to the information of the frequently used algorithms when the first voltage is higher than the second voltage,
 wherein the second memory cell corresponds to a second algorithm stored in the first memory unit.

12. The method of claim 11, wherein the first memory cell has a first switching device and a first charge storage element and the second memory cell has a second switching device and a second charge storage element.

13. The method of claim 11, wherein the information of frequently used algorithms comprises a suggest algorithm corresponding to a most frequently used algorithm, and
 wherein the suggest algorithm is the first algorithm.

14. The method of claim 11, wherein the sensing of the first voltage and the second voltage comprises comparing the first and second voltages with each other.

15. The method of claim 11, wherein the sensing of the first voltage and the second voltage comprises converting the first and second voltages to first and second digital voltage values, respectively.

16. The method of claim 12, wherein a magnitude of the first voltage is decreased by a value corresponding to one write to the first memory cell every a preset number of cycles of a clock signal, and
 wherein the preset number of cycles is controlled by adjusting a ratio of an on-state resistance and an off-state resistance of the first switching device.

17. A computer program product stored in a non-transitory computer-readable storage medium having computer readable program instructions, the computer readable program instructions read and carried out by a processing device for performing a method of processing a task based on information of frequently used algorithms learned through a memory unit, wherein the method comprises:

processing a first task of a first type using a first algorithm stored in a first memory unit;

providing a first write signal to a first memory cell of a second memory unit to write to the first memory cell, the first memory cell corresponding to the first algorithm;

sensing a first voltage stored in the first memory cell and a second voltage stored in a second memory cell in the second memory unit;

providing the information of frequently used algorithms to the processing device based on the sensed first and second voltages; and first accessing the first algorithm to process a second task subsequent to the first task according to the information of the frequently used algorithms when the first voltage is higher than the second voltage, wherein the second memory cell corresponds to a second algorithm stored in the first memory unit.

18. The computer program product of claim 17, wherein the first memory cell has a first switching device and a first charge storage element and the second memory cell has a second switching device and a second charge storage element.

19. The computer program product of claim 17, wherein the information of frequently used algorithms comprises a suggest algorithm corresponding to a most frequently used algorithm, and wherein the suggest algorithm is the first algorithm.

20. The computer program product of claim 18, wherein a magnitude of the first voltage is decreased by a value corresponding to one write to the first memory cell every a preset number of cycles of a clock signal, and wherein the preset number of cycles is controlled by adjusting a ratio of an on-state resistance and an off-state resistance of the first switching device.

* * * * *